INVENTOR
GARTH H. WILSON
BY
Flehr, Hohbach, Test, Albritton and Herbert
ATTORNEYS INVENTOR
GARTH H. WILSON
BY Flehr, Hohbach, Test, Albritton and Herbert
ATTORNEYS Jan. 20, 1970 G. H. WILSON 3,491,312
SWEEP OSCILLATOR HAVING A SUBSTANTIALLY CONSTANT OUTPUT POWER LEVEL
Filed Dec. 14, 1966 3 Sheets-Sheet 3

INVENTOR
GARTH H. WILSON
BY
Flehr, Hohbach, Test, Albritton and Herbert
ATTORNEYS United States Patent Office 3,491,312

Patented Jan. 20, 1970

3,491,312

SWEEP OSCILLATOR HAVING A SUBSTANTIALLY CONSTANT OUTPUT POWER LEVEL

Garth H. Wilson, Palo Alto, Calif., assignor to E-H Research Laboratories, Inc., Oakland, Calif., a corporation of California Filed Dec. 14, 1966, Ser. No. 601,671
Int. Cl. H03c *1/28, 3/30, 5/02*
U.S. Cl. 332—7 7 Claims

ABSTRACT OF THE DISCLOSURE

The power level of a backward wave oscillator used as a sweep oscillator is controlled by providing a feedback path from its helix output terminal through a programmed amplifier to the control grid of the BWO. The amplifier is programmed to compensate for variations in the sensitivity of the BWO which is determined by the amount of change in an input control voltage necessary to bring about a certain change in output power.

The present invention is generally directed to a sweep oscillator and specifically to a sweep oscillator having a relatively constant output level over its swept frequency range.

A signal source which tunes automatically through a preset frequency range at a certain rate is termed a sweep oscillator. In the microwave band the microwave signal source is usually a backward-wave oscillator (BWO). Control of the output radio frequency power of the BWO has been a major problem in sweep oscillators since power output normally varies throughout the operating frequency range.

Open loop control systems in which the output power is continually measured and thereafter adjusted to the proper value are cumbersome and impractical for many applications. Closed loop control systems provide automatic power leveling but have necessitated compromises in performance.

For example, the gain of the loop must be initially manually adjusted to prevent oscillation, and thereafter any change in power level requires a new gain adjustment.

It is a general object of the present invention to provide a sweep oscillator obviating the above deficiencies.

It is another object of the present invention to provide a sweep oscillator in which the power level is automatically stabilized over the entire operating frequency band and at all power levels.

It is another object of the invention to minimize fresuency variations due to changes in the accelerating voltages of a BWO other than the helix voltage.

It is another object of the invention to provide a sweep oscillator having a closed loop control system for the power level, the control system having a relatively low steady state error and a fast response time.

These and other objects of the invention will be apparent from the following description when taken in conjunction with the accompanying drawings.

Referring to the drawings.

In general, the invention relates to a sweep oscillator having a predetermined frequency range and having oscillator means with a predetermined transfer characteristic over this frequency range. The transfer characteristic or sensitivity relates the amount of change in an input control voltage necessary to bring about certain change in output power. For example, in the case of a backward-wave oscillator this can be expressed as volts of control voltage input as compared to the resultant change in milliwatts of output power. In a backward-wave oscillator the sensitivity varies over the swept frequency range. The present invention provides a feedback control loop which sensing the output power level, compares this level to a reference level which is coupled into a controller-amplifier, the controller-amplifier feeding a correction voltage to the grid input of the backward-wave oscillator. For maximum effectiveness of the feedback control loop, the controller-amplifier has its gain programmed to compensate for the variation of the sensitivity of the backward-wave oscillator across its frequency band. In broader terms, this means that the product of the gains or transfer characteristics of the backward-wave oscillator and the output power level sensor and the controller-amplifier is essentially constant. This achieves a fast response and low steady state error for the control system.

Figure 1:
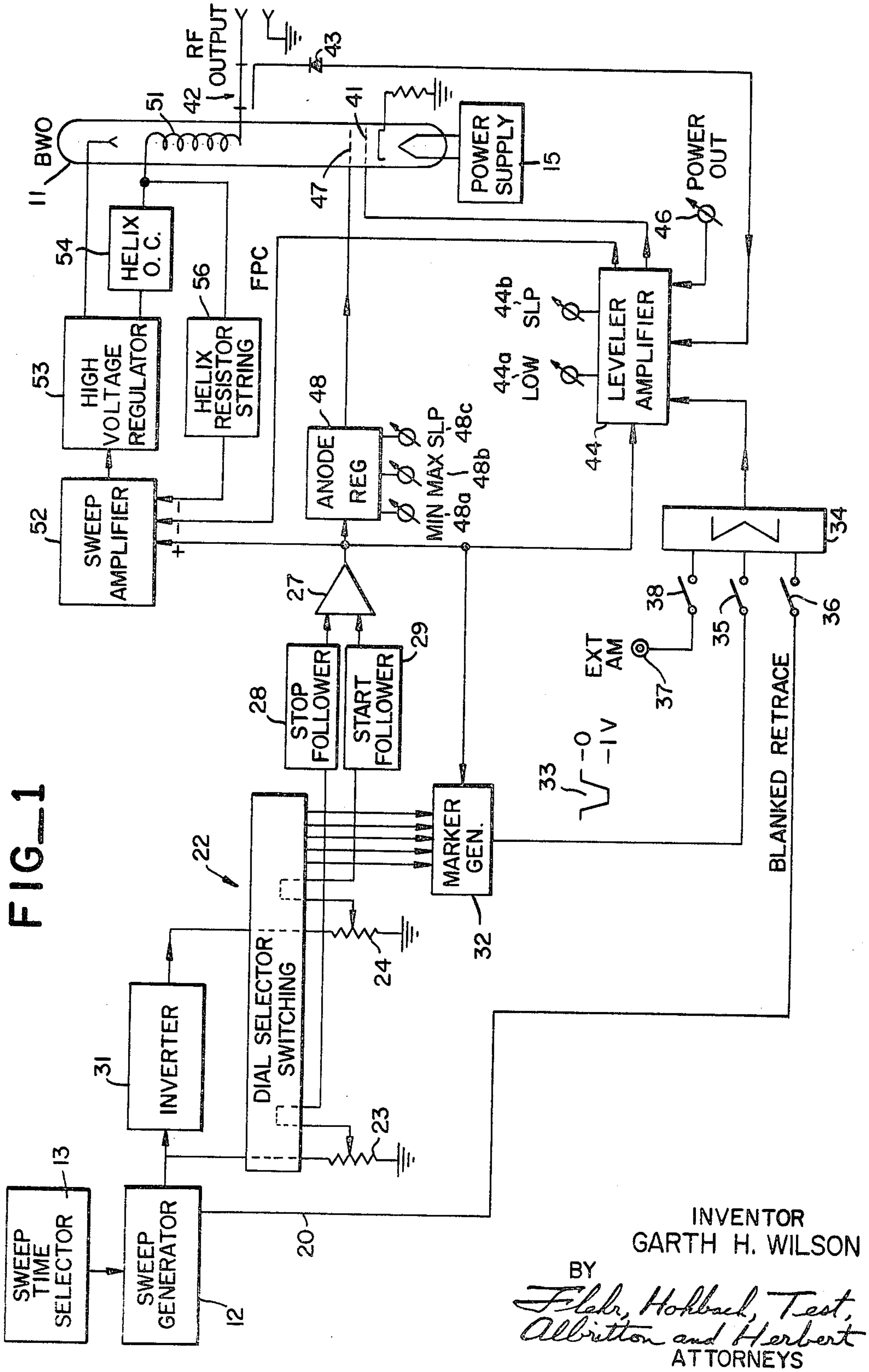
FIGURE 1 is a block diagram of a sweep oscillator constructed in accordance with the invention.
Figure 1A:
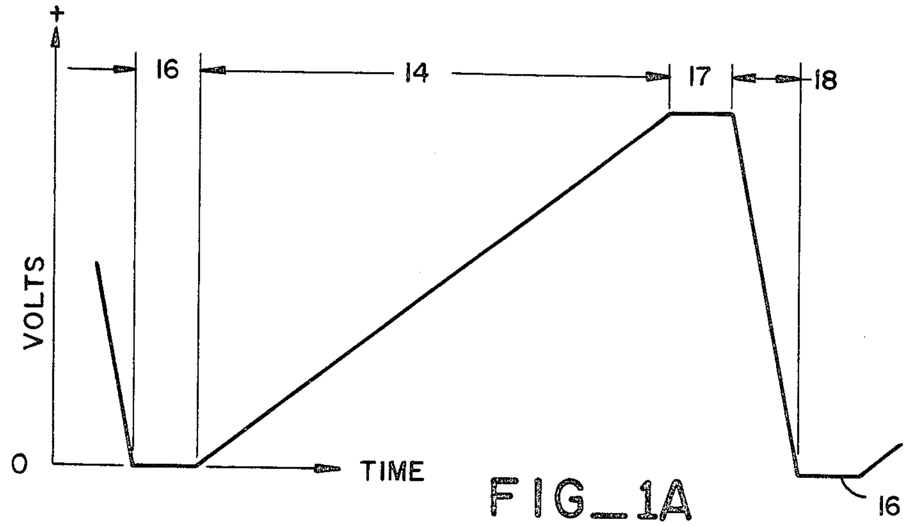
FIGURES 1A, 1B, 1C and 1D are waveforms and response characteristics related to FIGURE 1 and useful in understanding the invention.

The microwave sweep oscillator of the present invention (FIGURE 1) includes as the basic element a backward-wave oscillator (BWO) 11 which is voltage tuned and produces a radio frequency (RF) output over a preset range of frequencies. A power supply 15 is coupled to the heater element of BWO 11. A sweep generator 12 coupled to a time selector 13 producing a waveform as shown in FIGURE 1A determines the sweep time 14 of the RF output. The sweep waveform also includes a start dwell time 16, a stop dwell time 17, and a controlled retrace time 18. The dwell times and the controlled retrace time allow other components in the measurement system (for example detectors, recorders) sufficient settling time. Both dwell times and the retrace time are equal to approximately ten percent of the sweep time. When the sweep time is selected to be compatible with the response time of other system elements, the dwell and controlled retrace times allow the system to settle to the steady state condition before sweep direction is reversed.

Figure 1B:
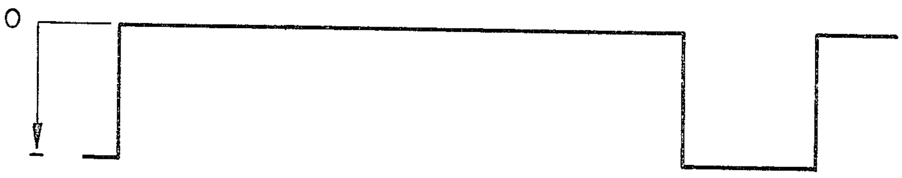

Sweep generator 12 also provides an appropriate blanking output pulse (FIGURE 1B) on line 20 which, when in operation, cuts off the radio frequency output power during retrace, the switching occurring at the approximate midpoints of the dwell times at each end of the sweep as shown in the drawing. This allows the system to settle before and after radio frequency output power is switched on or off at the end of the sweep, eliminating any interference of the subsequent sweep with a previous sweep.

Figure 2:
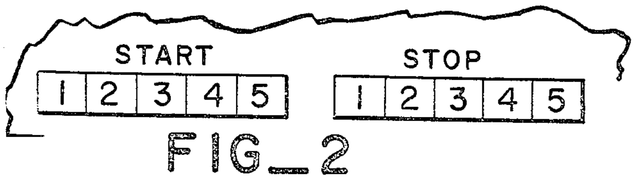
FIGURE 2 is a detail view of a portion of the control panel used in conjunction with FIGURE 1.

The output of sweep generator 12 is coupled to dial selector switching unit 22 which determines the starting and stopping frequencies of the swept oscillator. In practice, the present invention provides five different frequency settings at any one time, each of which is continuously adjustable over the bandwidth of the instrument. Potentiometers 23 and 24 represent only two of the five. Which of the five potentiometer controls are to be selected as the stop and start frequencies is determined by the dial selector switching device 22 which is illustrated in functional form in FIGURE 2 which shows five push-buttons for selecting any one of five potentiometers for the start frequency and similarly five push-buttons for selecting the stop frequency. The other three selected frequencies serve as markers which, as the RF output frequency is swept across its band, appear as spikes on an oscilloscope output display. If an external sweep mode is used, five markers are, of course, available. In summary, those potentiometer settings of frequency not selected as start-stop frequencies automatically become markers.

The sweep direction may be up or down in frequency, depending on which of the two desired sweep frequency limits is selected as start and which as stop.

The start and stop frequencies from representative potentiometers 23 and 24 are coupled to a summing amplifier 27 through series connected follower amplifiers 28 and 29 which provide for impedance transformation. Since the backward-wave oscillator 11 is a voltage tuned device, the potentiometers in essence adjust the voltage levels of the beginning and end of the sweep time trace 14 (FIGURE 1A). Very briefly, this is accomplished by the use of an inverter 31 coupling the start frequency potentiometer 24 to the output of sweep generator 12 which reverses the slope of the ramp output of the potentiometer as compared to the stop frequency ramp of potentiometer 23. A combination of these two ramps by summing amplifier 27 results in a final sweep output which has the proper voltage values.

The five frequency settings of switching unit 22 are coupled to a marker generator 32 which generates a spike 33, as illustrated, at each selected frequency in response to the coupled sweep output of amplifier 27. These are coupled into a summing device 34 through a switch 35.

Summing device 34 also has as inputs the blanking pulse of line 20 through a series connected switch 36, and an external amplitude modulation voltage input 37 which is coupled into the summing device through a switch 38. The output of summing device 34 provides for amplitude modulation of the radio frequency output waveform of the backward wave oscillator 11 as will be explained in detail below.

Sweep voltage from summing amplifier 27 is coupled to the helix coil 51 of BWO 11 through a series connected sweep amplifier 52, high voltage regulator 53, and helix over current detector 54, the latter serving to shut down the device if excessive current is drawn. A helix resistor string 56 is a part of a feedback loop between helix 51 and the input of sweep amplifier 52. Because of the inherent characteristics of the BWO tube, in order to sweep the radio frequency output linearly with time, the voltage applied to the helix must change exponentially with time. The feedback voltage provided by the helix resistor string 56 is regulated during the sweep, as will be discussed in detail below.

Before completing the discussion of the simplified block diagram, it should be noted that it is desirable that the power level of the radio frequency output be held constant at all frequencies as it is swept and at all relative power levels. In addition, good linearity and repeatability is desired between the frequency setting of the frequency potentiometers 23 and 24, and the actual output frequency, independent of the power level of the radio frequency output. Grid amplitude modulation varies beam current of the BWO tube which changes the actual output frequency somewhat.

At the present time, typical oscillator devices used for generating the RF swept frequency output, such as the BWO as used in the present invention, are non-linear in output frequency as a function of output frequency control signal, and show an undesirable degree of dependence of both the output frequency on the output power control signal, and the output power on the output frequency control signal. In the present invention these shortcomings are obviated by the circuitry which supplies these control signals. In accordance with the invention, there is provided a feedback loop between the RF output of BWO 11 and a grid input 41 of the BWO which controls beam current, thereby controlling radio frequency output power which is a function of beam current. This loop includes a directional coupler 42 coupled to the RF output line of BWO 11, diode 43 connected in series with the output of the coupler 42, and a leveler amplifier 44 which has an output coupled to grid 41. Amplifier 44 serves as a controller element in the closed loop control system, and the BWO 11 is the controlled system. A reference voltage is provided by the power out control 46 which is coupled to leveler amplifier 44.

From a control system point of view BWO 11, coupler 42, and detector 43 may be regarded as having a first transfer characteristic, $G_1$, and leveler amplifier 44 as having another transfer characteristic, H. The product $HG_1$ is an open loop transfer characteristic which is of crucial importance in determining the performance of the closed loop control system. For example, if the absolute value of $HG^2$ is greater than unity when its phase lag reaches 180° between the input and output, the system becomes unstable. However, for low steady state errors in the control system and fast response, the gain, H, of the controller should be as high as possible. Thus, normally, a compromise must be made in that at the higher frequencies, especially for a BWO type amplifier, its transfer function has a much higher value than at lower frequencies; for example, typical sensitivities are 100 milliwatts per volt, at 2 gigahertz and at the lower frequency of 1 gigahertz, 10 milliwatts per volt. Sensitivity is defined as the change in output power level divided by the change of input voltage required to produce that change. Thus, ordinarily, the maximum allowable controller-amplifier gain is determined by the maximum sensitivity of the oscillator device because of inherent instability. The attendant reduction of loop gain when the sensitivity of the oscillator device drops causes a relative increase in steady state error and a slowing of response time. The present invention solves the above problem by programming amplifier 44 to have a transfer characteristic which compensates for the transfer characteristic of BWO 11. More specifically, with the sensitivity examples given for the BWO 11, the leveler amplifier 44 might have a gain characteristic as shown in FIGURE 1C where at the lower frequencies, such as the 1-gigahertz range, the gain is high and at the higher frequencies it is lower.

Figure 1C:
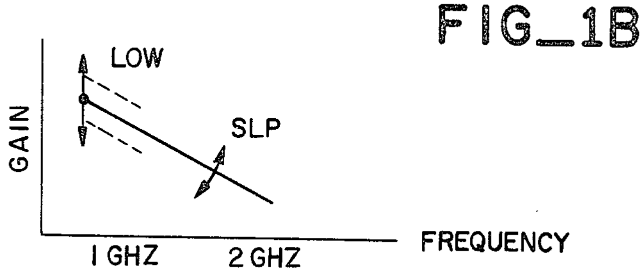

Means for programming the gain of the leveler amplifier are provided by low and slope (SLP) controls, the low control providing a vertical displacement of the characteristic curve of FIGURE 1C, and the slope control changing the slope with the low point as the center of movement. In the above manner, the product of H, the gain of the amplifier, and $G_1$, the transfer characteristic of the BWO, is maintained at a relatively constant value throughout the swept frequency range and this value may be maximized to minimize steady-state error and response time. No reajustment of amplifier gain is necessary for either a change in power level or swept frequency range.

Figure 1D:
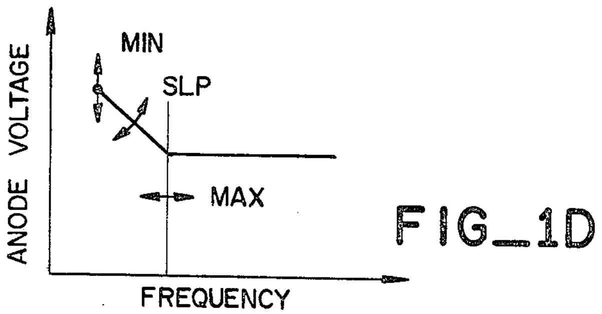

Open loop power leveling is also provided by regualtion of the anode 47 of BWO 11 by an anode regulator 48 which is coupled between the anode and summing amplifier 27. Regulator 48 has minimum (MIN) maximum (MAX) and slope (SLP) controls which rough levels power output. More specifically, as shown in FIGURE 1D, MIN controls the vertical displacement of the low frequency end of the gain characteristic SLP, the slope of the left portion of the curve, and MAX controls the breaking point between the left and right halves of the curve.

Because of the modulation of the grid 41 and the resultant changing of the beam current, output frequency of the BWO is also undesirably changed and this frequency shift is termed "frequency pushing." To minimize frequency pushing, a feedback labelled "FPC" (Frequency Pushing Compensation) is provided between leveler amplifier 44 and helix coil 51 of the BWO through sweep amplifier 52. Details of this compensating circuit are shown in FIGURE 3.

Figure 3:
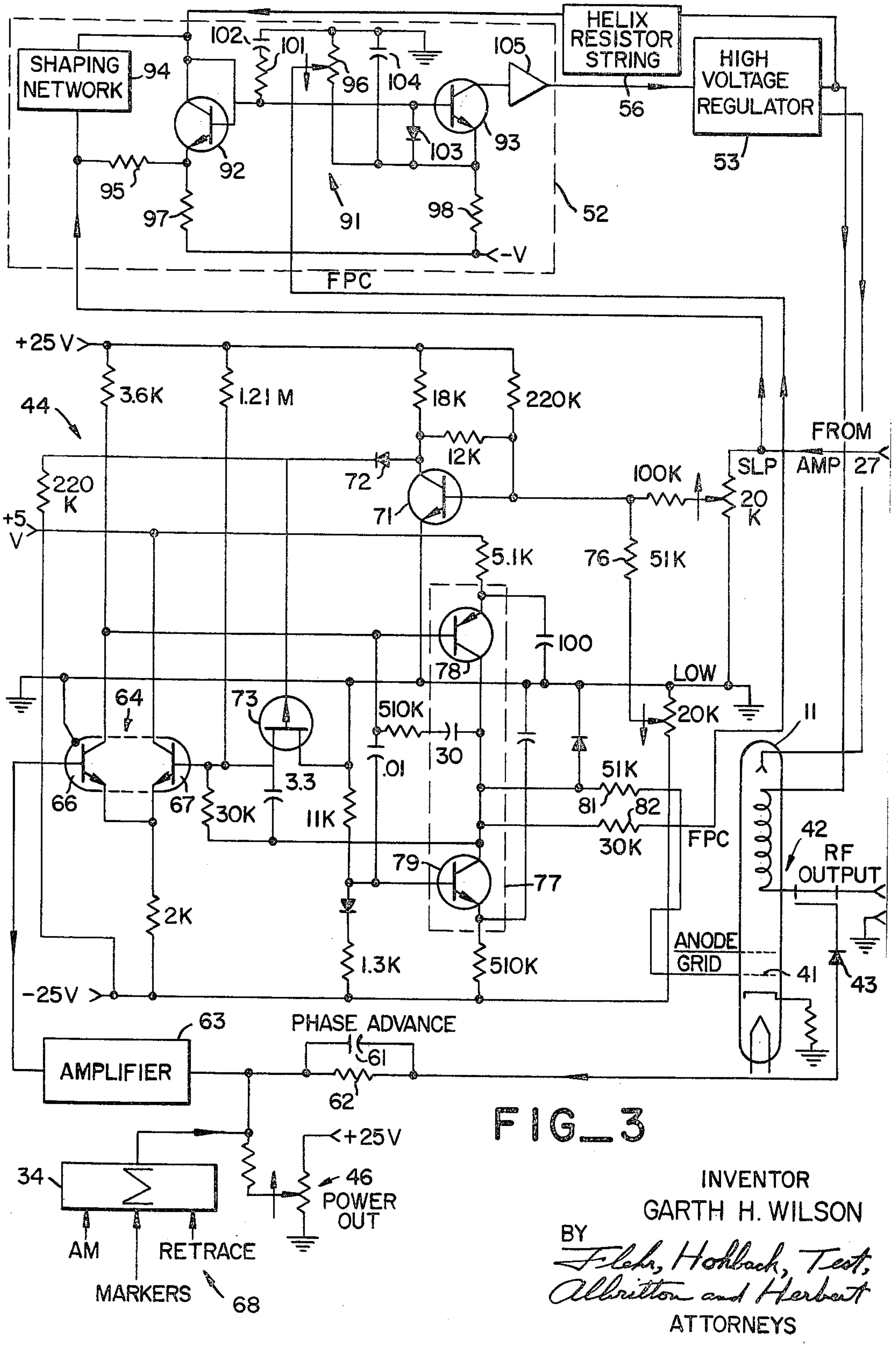
FIGURE 3 is a detailed circuit diagram of a portion of FIGURE 1.

Details of leveler amplifier 44 and its feedback control loop with BWO 11 and sweep amplifier 52 are shown in FIGURE 3. The output of directional coupler 42 is coupled into a phase advance network comprising parallel connected capacitor 61 and resistor 62. Advancing the phase of the feedback signal contributes to the stabilization of the control loop. Network 61, 62 is coupled to a constant gain amplier 63 which in turn has its output coupled to a differential amplifier 64 comprising matched transistors 66 and 67.

A reference voltage for the control loop, generally indicated at 68, is also coupled into the input of amplifier 63. This includes Power Out control 46 which is a potentiometer variable between ground and a positive voltage supply here, for example, designated a plus 25 volts. Summing device 34 is also coupled to amplifier 63 which provides amplitude modulation of the RF output along with the markers and the blanking of the sweep retrace. The reference voltage input 68 generally determines the instantaneous power output level of BWO 11.

Swept output from amplifier 27 is coupled into the slope (SLP) potentiometer control which drives a programming amplifier 71. The collector output of the amplifier is coupled through a diode 72 to the gate of a field effect transistor 73 which serves as a voltage variable resistance. The source terminal of transistor 73 is coupled to the base of transistor 67 of differential amplifier 64. The base input of programming amplifier 71, in addition to being regulated by the SLP control, has in parallel across it the Low control which is a potentiometer variable between ground and a negative voltage, here designated as a minus 25 volts, which is coupled through a resistor 76 to the base input.

The output of the differential amplifier 64 is taken from the collector of transistor 66 and coupled to dual base inputs of a push pull amplifier 77, indicated by the dashed block, which includes transistors 78 and 79. The push pull output is through the tied collectors of transistors 78 and 79; output control voltage for grid 41 of the BWO is coupled through a series connected resistor 81 and the frequency pushing compensation output (FPC) is coupled to sweep amplifier 52 through a series connected resistor 82. All of the active components of leveler amplifier 44 are properly biased and bypassed by resistors and capacitors whose values are indicated on the drawing with the resistor values in ohms and the capacitor values in microfarads, unless otherwise specified.

In operation the slope and low controls provide the leveler amplifier 44 with a transfer characteristic in the feedback loop between the output and input of BWO 11, which compensates for the variation of the sensitivity of BWO 11 with swept output frequency. This provides a leveled power output while at the same time maintaining the feedback control amplifier gain at a maximum level for low steady state error and fast response time for the control loop.

The frequency pushing compensation (FPC) output from leveler amplifier 44 is coupled into sweep amplifier 52 and more specifically into a comparator or differential amplifier 91 comprising matched transistor pair 92, 93. Amplifier 91 compares the FPC input, which is coupled into a potentiometer 96, with an input from sweep output amplifier 27, which is coupled into the emitter circuit of transistor 92 through a resistor 95. A feedback voltage from the helix string 56 and the output of the high voltage regulator 53 is connected to the collector of transistor 92. A shaping network 94 is coupled in parallel across the emitter and collector of transistor 92. In a manner well known in the art the shaping network compensates, by means of this feedback loop, for output frequency non-linearity of BWO 11 as a function of BWO helix voltage. However, in accordance with the invention, this normal function of the comparator amplifier 91 and shaping network 94 is modified by the FPC input which modulates the correction introduced by shaping network 94 to compensate for frequency pushing.

Comparator amplifier 91 includes biasing resistors 97 and 98 which couple the emitters of transistors 92 and 93 to a minus voltage level. The bases of these transistors are tied together and this common line is coupled to ground through a series resistor-capacitor network 101, 102. The emitter of transistor 93 is coupled to the common base connection line by a diode 103 and in addition to ground by a capacitor 104. The output of the comparator amplifier 91 is taken from the collector of transistor 93 and is coupled to high voltage regulator 53 through an amplifier 105.

In operation the sweep output of amplifier 27 provides a sweep voltage to sweep amplifier 52 which controls the frequency of BWO 11. Linearity is maintained by the shaping network 94 and, in accordance with the invention, by provision of the frequency pushing compensation input from leveler amplifier 44 which as discussed above compensates for the frequency pushing due to the modulation of the grid of BWO 11.

Thus, the invention has provided an improved sweep oscillator which automatically maintains its RF power level over the entire operating frequency band and at all power levels. This is accomplished by use of a closed, loop feedback control system in which steady state error and response time is minimized. At the same time frequency pushing error is minimized.

I claim:

1. In a sweep oscillator having a predetermined frequency range and having oscillator means including sweep means for receiving a sweep voltage to vary the output frequency of the output signal of said oscillator means over said frequency range and including power lever control means for receiving a power control signal to control the output power level of said output signal said oscillator means having a predetermined transfer characteristic over such frequency range relating the output power of the output signal at any given frequency within said range to said power control signal, such transfer characteristic varying nonlinearly over said operating frequency range, a feedback control loop coupling the output of said oscillator means to said power level control means including amplifier means having a transfer characteristic which varies in such a manner as to substantially compensate for the variance of said transfer characteristic of said oscillator means said loop also including reference standard means to which said amplifier means is responsive for producing a control signal indicative of error between said power level and said reference standard and including means for programming the gain of said amplifier to compensate for said nonlinearity of said transfer characteristic of said oscillator means said gain compensation being indicative of said transfer characteristic of said amplifier means said compensation providing a product of said two transfer characteristics which is substantially a constant whereby a relatively constant power output level is provded.

2. In a sweep oscillator as in claim 1 including means for advancing the electrical phase of a portion of the output signal which is coupled to the input of said amplifier.

3. In a sweep oscillator as in claim 1 where said oscillator means is a backward-wave oscillator and said power control signal is applied to the grid of said backward-wave oscillator.

4. In a sweep oscillator as in claim 3 including means coupled between the helix coil of said backward-wave oscillator and the grid for correcting for frequency pushing caused by varying said grid input.

5. In a sweep oscillator as in claim 3 in which amplitude modulation of said output is provided by varying grid input.

6. In a sweep oscillator having a predetermined frequency range and including a backward-wave oscillator having a helix coil and a control grid, in which a sweep voltage is applied to said helix to vary the output frequency over said frequency range and in which a control signal is applied to said control grid to control the output power level, said backward wave oscillator having a sensitivity characteristic in which the ratio of output power to the magnitude of the input control signal varies non-linearly with a variation in the output frequency, a feedback control loop for comparing said output power level to a reference standard and producing a resultant control signal to maintain a substantially constant output power level, said loop including means for sensing said output power level, reference standard means, amplifier means coupled to said power level sensing means and said reference standard means for producing a control signal indicative of error between said power level and said reference standard, means for programming the gain of said amplifier to compensate for said non-linearity of said sensitivity of said backward-wave oscillator a larger gain being provided at relatively lower frequencies of the sweep range, whereby the product of the transfer characteristic of said backward-wave oscillator as represented by said sensitivity characteristic and the transfer characteristic of said amplifier as represented by its gain is substantially a constant.

7. A sweep oscillator as in claim 6, in which said means for programming the gain of said amplifier includes means responsive to said sweep voltage for modifying said sweep voltage in accordance with predetermined parameters which modified sweep voltage controls the gain of said amplifier, said amplifier also including means for modulating the amplitude of the control signal coupled to the grid of the backward-wave oscillator whereby the output signal is also modulated.

References Cited

UNITED STATES PATENTS

| | | | |
|---|---|---|---|
| 2,654,071 | 9/1953 | Harris | 332—25 |
| 2,795,698 | 6/1957 | Cutler | 332—13 X |
| 2,888,646 | 5/1959 | Ringoen | 332—7 |
| 3,327,245 | 6/1967 | Britton | 331—82 X |

ALFRED L. BRODY, Primary Examiner

U.S. Cl. X.R.

331—6, 81; 332—13, 25, 58; 328—232